June 22, 1971 YOSHIYUKI KANEDA ET AL 3,585,713

METHOD OF MAKING CONNECTING PARTS OF SEMICONDUCTOR
DEVICES OR THE LIKE
Filed March 24, 1969

INVENTORS
YOSHIYUKI KANEDA
SAKAN IWASHITA AND
SHINICHI HISHIKAWA

BY Lewis H. Eslinger
ATTORNEYS

United States Patent Office 3,585,713
Patented June 22, 1971

3,585,713
METHOD OF MAKING CONNECTING PARTS OF SEMICONDUCTOR DEVICES OR THE LIKE

Yoshiyuki Kaneda, Sakan Iwashita, and Shinichi Hishikawa, Kanagawa-ken, Japan, assignors to Sony Corporation, Tokyo, Japan Filed Mar. 24, 1969, Ser. No. 809,741
Claims priority, application Japan, Mar. 25, 1968, 43/19,254
Int. Cl. B01j *17/00;* H01l *5/00*
U.S. Cl. 29—578 7 Claims

ABSTRACT OF THE DISCLOSURE

A semiconductor device having ohmic contacts applied to a semiconductor wafer through windows in a glass or other insulating layer on a surface of the wafer is provided with metal bumps or protuberances for connecting the contacts with corresponding conductors of a header or printed circuit by covering the entire wafer surface with a layer of tin or other metal having no affinity for the insulating layer and strong affinity for the contacts, selectively depositing on regions of the tin layer which correspond to at least portions of the contacts metal, such as lead or an alloy thereof, for forming the desired protuberances or bumps and for which the tin layer has a strong affinity, and then heating the resulting structure so that the tin layer is aggregated on the ohmic contacts as a result of its surface tension and causes a corresponding aggregation of the bump or protuberance forming metal.

Figure 1A:
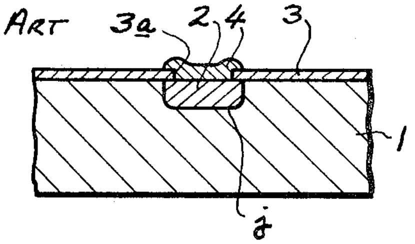
Fig. 1A PRIOR ART

This invention relates to a method of making connecting parts of a semiconductor device or the like, and more particularly is directed to a method for forming metal bumps on semiconductor devices by which the ohmic contacts of the latter may be connected with corresponding conductors of a header or printed circuit.

There has been adopted in the art of semiconductor devices the so-called face-down bond method by which electrodes or contacts of a semiconductor chip that includes a plurality of semiconductor units or semiconductor elements to constitute a semiconductor integrated circuit are electrically and mechanically coupled directly with corresponding conductors of a header or printed-circuit board. In such face-down bond method, metal bumps, such as metal balls, projections or the like, of solder or the like are disposed on the electrodes or contacts of the semiconductor chip which are to be electrically connected to the conductors of the header or the printed-circuit board, thus providing the so-called flip-tip semiconductor device.

A conventional method for the formation of the metal bumps involves the steps of depositing an insulating layer, as of glass or the like, over the entire area of a semiconductor wafer, removing the insulating layer at selected areas to form windows therein, depositing ohmic contacts, as of aluminum or the like, on the semiconductor wafer exposed through the windows, coating the entire area of the insulating layer and the ohmic contacts with a metal, for example tin, having no affinity for the insulating layer and strong affinity for the ohmic contacts, heating the resulting structure to aggregate the tin over the ohmic contacts, and seelctively vapor-depositing the bump-forming metal, such as lead, on the aggregated tin. With this method, however, the tin projects form the surface of the semiconductor wafer, so that the mask for the selective vapor deposition of the lead cannot be placed in close contact with the wafer, which makes it impossible to deposit the lead accurately on the tin and inevitably allows the lead to spread at the foot of each bump beyond the mask opening. This spreading of the lead at the foot of each bump may lead to short-circuiting between closely adjacent contacts or electrodes of the semiconductor device.

Accordingly, it is an object of this invention to provide a method of forming metal bumps of accurately predetermined extent and positioning.

Another object is to provide a method of forming metal bumps which produces a high yield of useable devices.

Still another object of this invention is to provide a method of forming metal bumps which does not require the use of a high-precision mask and is suitable for mass production.

In accordance with this invention, after the formation of the ohmic contacts, a metal layer such as of tin, which has no affinity for the insulating layer is deposited on the entire area of the semiconductor wafer, after which a metal for forming the desired metal bumps is selectively deposited on the tin layer and then the resulting structure is heated to fuse and thereby aggregate the tin and also any of the bump forming metal that may have spread beyond the desired region, such aggregation resulting from the surface tension of the tin melted by heating.

The above, and other objects, features and advantages of this invention, will be apparent in the following detailed description which is to be read in conjunction with the accompanying drawing, wherein:

FIGS. 1A–1D are sectional views illustrating the sequence of steps involved in the formation of metal bumps or semiconductor elements in accordance with a conventional method, and to which reference is hereinafter made for explaining the present invention; and FIGS. 2A–2D are similar views illustrating a sequence of steps employed in the formation of metal bumps or semiconductor elements in accordance with an embodiment of this invention.

Figure 1B:
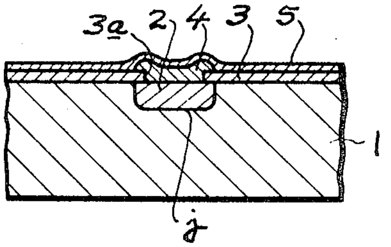
Figure 1C:
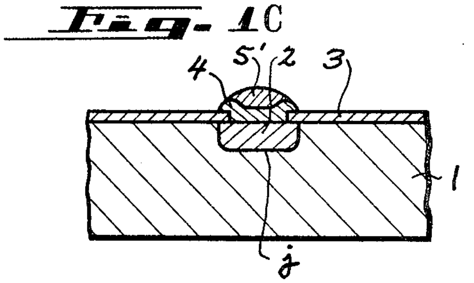
Figure 1D:
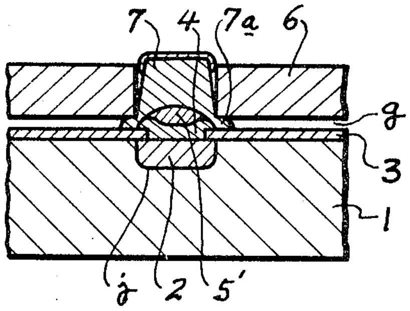

In FIG. 1A there is illustrated a semiconductor element having a junction *j* formed in a semiconductor chip 1 by a region 2 which is to be electrically and mechanically connected with wiring, for example, on a header or a printed-circuit board. In order to make possible such connection, it is the standard practice to provide a metal bump protruding from an electrode in ohmic contact with region 2. In the conventional method of forming the electrode and then the metal bump, the surface of the semiconductor chip 1 is coated with an insulating layer 3, as of glass or the like, in such a manner as to extend over the junction *j*. In the illustrated case, the insulating layer 3 is laid over the entire surface of chip 1, including the region 2, and a window 3*a* is formed in the insulating layer 3 on the region 2, through which window 3*a* an electrode 4, for example, of aluminum, is vapor-deposited on the region 2 so as to effect ohmic contact therewith (FIG. 1A). Next, the semiconductor chip 1 is coated over the entire area of its upper surface with a metal layer 5, for example, of tin, which has no affinity for the glass layer 3 but has an affinity for the electrode 4 and for a metal bump or protuberance to be ultimately formed thereon (FIG. 1B). Thereafter, the semiconductor chip 1 is heated to melt the tip layer 5 and to cause it to aggregate, as at 5′, due to its surface tension. The aggregation of the tin layer 5 is achieved because of its very low affinity for the glass layer 3 and its great affinity for the electrode 4 and further by reason of the fact that its surface tension exceeds its affinity for the glass layer 3 (FIG. 1C).

Following this, a metal bump 7, for example, of lead, is vapor-deposited on the aggregated tin layer 5′ overlying the electrode 4 through a vapor-deposition mask 6. However, in practice, the material from a vapor deposition material source is not directed perpendicularly to the semiconductor chip 1 and, since the metal mask 6 and the semiconductor chip 1 are not perfectly plane, they do not precisely adhere to each other and a gap *g* exist therebetween. Thus, the vapor deposited metal extends beyond the opening in mask 6 to form an excess metal layer 7*a* at the foot of the metal layer 7. Accordingly, the described conventional method cannot form the metal bump 7 with high precision and introduces the possibility that the excess metal layer 7*a* may extend into contact, and thus be short-circuited with closely adjacent metal bumps and electrodes on the semiconductor element. Especially in the formation of many elements on a common semiconductor chip, as in the case of semiconductor integrated circuits, the presence of such excess metal layer 7*a* at the foot of each metal bump 7 is likely to cause short-circuiting between the electrodes, whereby to lower the yield of useful or defect-free completed products.

Figure 2A:
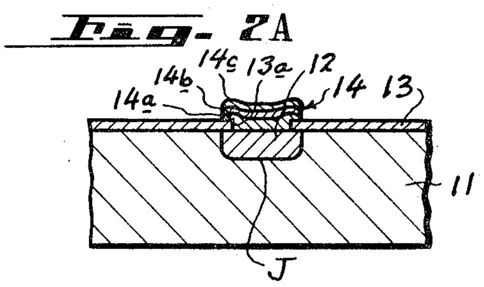

Referring now to FIG. 2A, it will be seen that a semiconductor chip 11 is there shown to have semiconductor elements making up, for example, semiconductor units or a semiconductor integrated circuit, with one of such elements being formed by a region 12 forming a junction *j* between it and an adjacent region of chip 11.

In the first step according to this invention, a glass or silicon dioxide layer 13 coated on the upper surface of the semiconductor chip 11 to form an insulating layer and the layer 13 is removed at a selected area by photoetching or the like to form therein a window 13*a* on the region 12. An electrode 14 is deposited on the exposed surface of region 12 so as to be in ohmic contact therewith (FIG. 2A). In the event that the semiconductor chip 11 is formed of silicon, the electrode 14 may be formed by depositing on region 12 an aluminum layer 14*a* having a great affinity for silicon, coating the aluminum layer 14*a* with a titanium layer 14*b* as an intermediate layer, and then coating the layer 14*b* with a nickel layer 14*c* to provide the electrode 14 with enhanced mechanical strength.

Figure 2B:
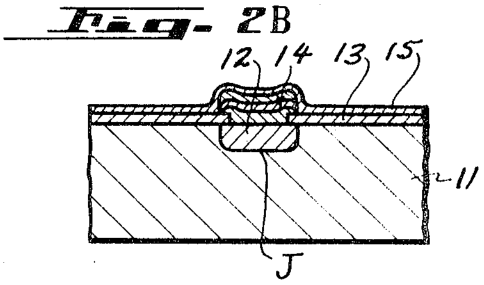

Thereafter, as shown on FIG. 2B, substantially the entire area of the upper surface of the semiconductor chip 11 including at least the area on the electrode 14 to be ultimately occupied by a metal bump or protuberance has vapor-deposited thereon, to a thickness of several microns, a layer 15, for example, of tin, which has a great affinity for the electrode 14, and more specifically for the layer 14*c* but little affinity for the insulating layer 13. Further, the surface tension of the tin or other metal employed for layer 15 is greater than the affinity thereof for the glass or other insulating layer 13, and the metal of layer 15 is also selected to have a great affinity for the metal to be employed in forming the bump or protuberance on electrode 14.

In accordance with this invention, aggregation of the tin layer 15 by melting is not effected immediately after its formation, but instead metal for ultimately forming the metal bump is vapor-deposited on the layer 15 while the latter is in overlying relation to the insulating layer 13. More specifically, as shown on FIG. 2C, a metal mask 16, which has windows 16*a* corresponding to the pattern of metal bumps or protuberances which it is desired to produce, is placed on the semiconductor chip 11 coated with the aforementioned layers 13 and 15 and a metal material, for example, lead, for ultimately forming the metal bumps is vapor-deposited through windows 16*a* to a thickness of 30 to 100 microns as indicated at 17′. If necessary, a metal layer 18, for example, of silver or the like, may be vapor-deposited through each window 16*a* on the layer 17′. As before, since the vapor-deposition material source is placed relatively close to the semiconductor chip 11 and the vapor deposited material from such source is not directed perpendicularly to the chip 11 and since a gap G exists between the metal mask 16 and the chip 11, as previously described with reference to FIG. 1D, an excess metal layer 17*a′* is formed around the metal bump material layer 17′. However, in accordance with this invention, after the vapor deposition of the material 17′, the semiconductor chip 11 is heated up to a temperature, for example, of 430° C., which exceeds the melting temperature for the metal layer 15, thereby melting the layer 15.

Figure 2C:
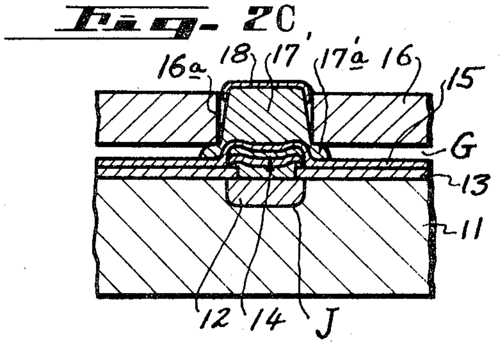
Figure 2D:
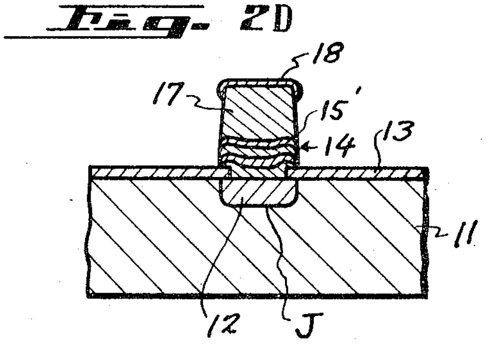

Thus, since the metal layer 15 has little affinity for the insulating layer 13 but great affinity for the electrode 14 and the metal bump material layer 17′, the layer 15 is caused by its surface tension to aggregate on the electrode 14, as at 15′, and, at the same time, the tin of the layer 15′, the lead of the layer 17′ and the silver of the layer 18 are alloyed together to form a bump 17 (FIG. 2D). Although bump 17 is formed of the tin-lead-silver alloy, silver prevails at the surface of the bump and tin prevails at the portion of bump adjacent electrode 14. Although the vapor deposited metal bump material layer 17′ has the excess layer 17*a′* at the foot thereof, as described above, it has been ascertained that such excess layer 17*a′* is aggregated onto the electrode 14 by the melting of the metal layer 15 so that the completed bump 17 (FIG. 2D) is precisely confined to the area of electrode 14.

Further, if the tin of metal layer 15 partly remains on insulating layer 13, it is preferred to coat a flux, for example, rosin, on the insulating layer 13 and to heat the chip 11 up to approximately 34° C. so as to cause the remaining tin to aggregate onto the bump 17.

Each metal bump 17 thus formed on a semiconductor device may be fused to contact with its corresponding wire of a header or a printed-circuit board thereby to mechanically attach the semiconductor chip 11 to the header or printed-circuit board and to electrically connect each region 12 to a wire corresponding thereto.

As has been described above, the present invention provides metal bumps in a precisely predetermined pattern, so that there is no possibility of any of the bump short-circuiting with a bump or electrode adjacent thereto, whereby to increase the yield of useful or non-detective semiconductor devices that are produced.

Further, since the metal bumps are formed by the aggregation of the metal layer 15 subsequent to the vapor deposition of the metal bump material layer 17′, the pattern of the vapor deposition need not be controlled with as high precision as heretofore, thereby to simplify the making of the mask and the masking operation and hence facilitate mass production of the semiconductor devices.

In the illustrated example, the electrode 14 is deposited substantially only on the region 12 which is to be connected with other circuit elements. However, the electrode 14 may be formed partly over the region 12 and partly over the insulating layer 13, and the metal bump 17 may be formed on the part of electrode 14 that is remote from the region 12. Further, it will be apparent that the present invention is applicable to the case where the electrode 14 extends between circuit elements formed in the chip 11 for interconnecting such circuit elements of, for example, a semiconductor integrated circuit, and the metal bump is formed on the electrode providing internal connections.

It will also be apparent that the method according to this invention may be employed for the formation of metal bumps or wiring portions of a header or a printed-circuit board with which a semiconductor chip is to be coupled electrically and mechanically.

Although an illustrative embodiment of this invention has been described in detail herein with reference to the drawing, the invention is not limited to that precise embodiment, and the above mentioned, and other variations and modifications, may be effected therein without departing from the scope or spirit of this invention.

What is claimed is:

1. A method of providing an electrical circuit device with metal protuberances extending from contact area spaced from each other at a surface of said device, comprising depositing on said surface of the device a layer of a first metal having great affinity for said contact areas and substantially little affinity for the regions of said surface between said contact areas, vapor-depositing a second metal on selected areas of said metal layer substantially corresponding to at least portions of said contact areas while said first layer still covers said surface between said contact areas, and fusing said first and second metals by heating at least to the melting temperature of said first layer so that said first metal is aggregated on said contact areas due to its surface tension and correspondingly limits the extent of said second metal to form the desired protuberances from the latter.

2. The method according to claim 1, in which said electric circuit device includes a semiconductor wafer having a plurality of semiconductor elements formed therein and engaged by ohmic contacts deposited on said wafer through windows in an insulating layer on the latter, said ohmic contacts constitute said contact areas, and said insulating layer constitutes said regions of the surface between said contact areas.

3. The method according to claim 2, in which said first metal is tin.

4. The method according to claim 3, in which said insulating layer is selected from the group consisting of glass and silicon dioxide.

5. The method according to claim 3, in which said second metal is lead.

6. The method according to claim 3, in which said second metal is lead and a layer of silver is provided over the lead, so that, in each of said protuberances, there is an alloying of tin, lead and silver with the surface of each protuberance being predominantly silver and with the portion of each protuberance adjacent the respective contact being predominantly tin.

7. The method according to claim 3, in which a flux is applied to said insulating layer to ensure the complete removal of said first metal therefrom upon said heating.

References Cited

UNITED STATES PATENTS

| | | | |
|---|---|---|---|
| 3,287,612 | 11/1966 | Lepselter | 29—578X |
| 3,386,894 | 6/1968 | Steppat | 29—578X |
| 3,458,925 | 8/1969 | Napier et al. | 29—590X |
| 3,461,462 | 8/1969 | Ruggiero | 29—590X |
| 3,503,124 | 3/1970 | Wanlass et al. | 29—578X |

JOHN F. CAMPBELL, Primary Examiner

W. TUPMAN, Assistant Examiner

U.S. Cl. X.R.

29—590; 117—212